United States Patent
Shih

(10) Patent No.: US 6,557,960 B2
(45) Date of Patent: May 6, 2003

(54) SLIDE OUT SUPPORT FOR SERVER CABINET

(76) Inventor: Shoei-Yuan Shih, No. 8, Lane 85, Hsing-I Rd., Pei-Tou Dist., Taipei (TW)

(*) Notice: Subject to any disclaimer, the term of this patent is extended or adjusted under 35 U.S.C. 154(b) by 0 days.

(21) Appl. No.: 10/045,047

(22) Filed: Jan. 15, 2002

(65) Prior Publication Data

US 2002/0074914 A1 Jun. 20, 2002

Related U.S. Application Data

(63) Continuation of application No. 09/736,214, filed on Dec. 15, 2000, now abandoned.

(51) Int. Cl.[7] ............................................. A47B 88/00
(52) U.S. Cl. ................................. 312/334.5; 312/334.17
(58) Field of Search ........................... 312/334.4, 265.1, 312/265.2, 334.5, 223.1, 265.4; 248/906, 909, 674, 675, 200.1; 211/26, 190, 187

(56) References Cited

U.S. PATENT DOCUMENTS 3,133,768 A * 5/1964 Klakovich .................. 312/323
3,528,636 A * 9/1970 Schmidt ...................... 220/3.9
6,070,957 A * 6/2000 Zachrai ..................... 312/265.1

* cited by examiner

Primary Examiner—Lanna Mai
Assistant Examiner—Jerry Anderson
(74) Attorney, Agent, or Firm—Bacon & Thomas

(57) ABSTRACT

An improved slide out support to be mounted at two sides of a server cabinet for holding and drawing a computer processor in the cabinet includes a front beam slidably engaged with a rear beam. The front and rear beam have respectively a first and a second fastening flange formed and bent at a selected angle at two ends thereof for engaging with the front and rear struts of the cabinet. The front and rear beams also have respectively an engaging member which are engageable with each other at various positions such that the engaged front and rear beam may be extended or shortened to a length desired for mounting to the cabinet of different lengths.

1 Claim, 7 Drawing Sheets

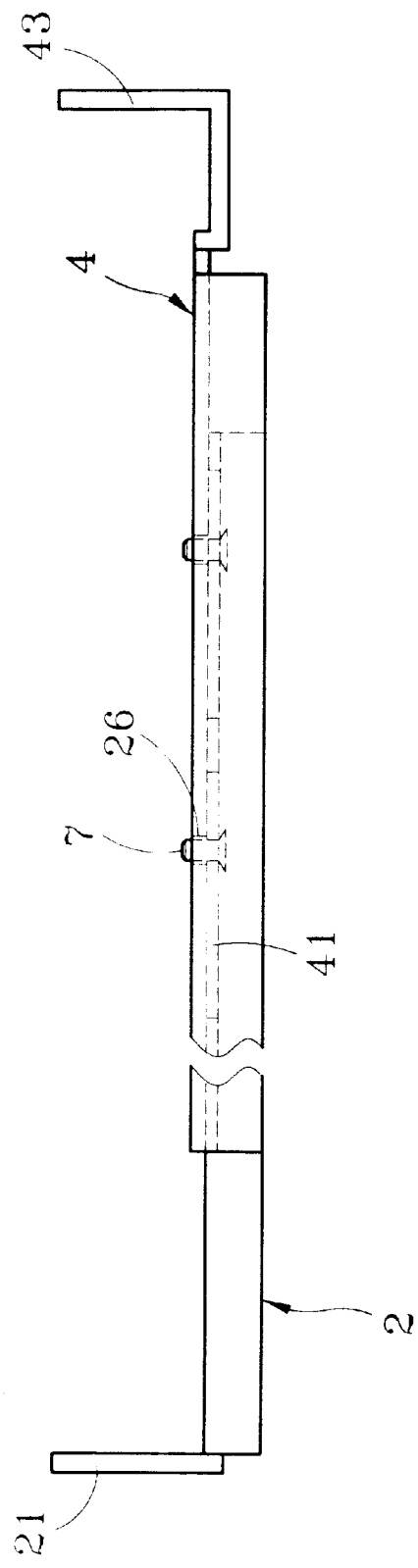
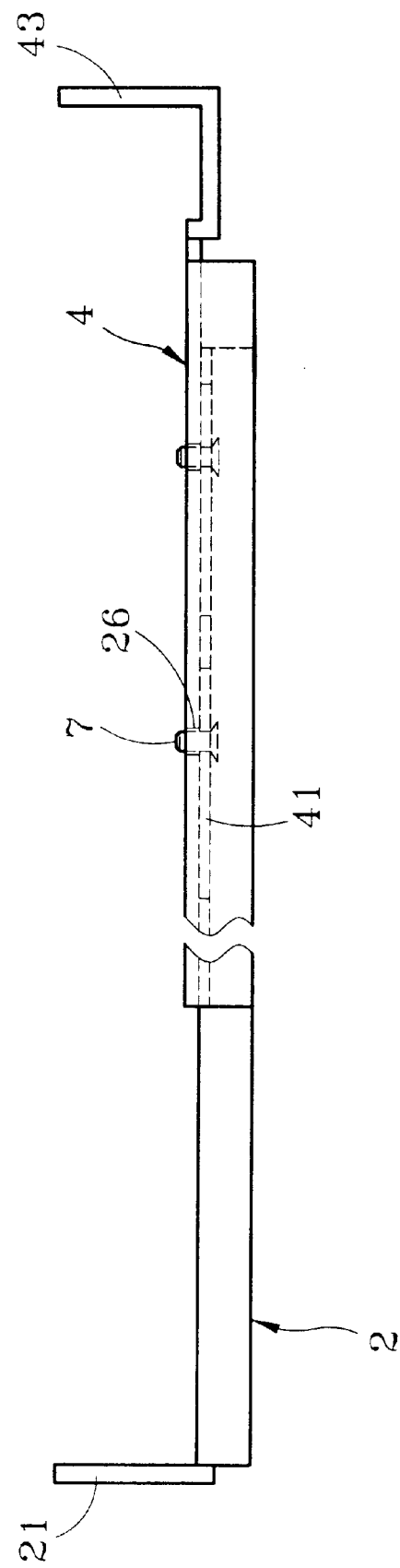
Fig.4A
Fig.4B

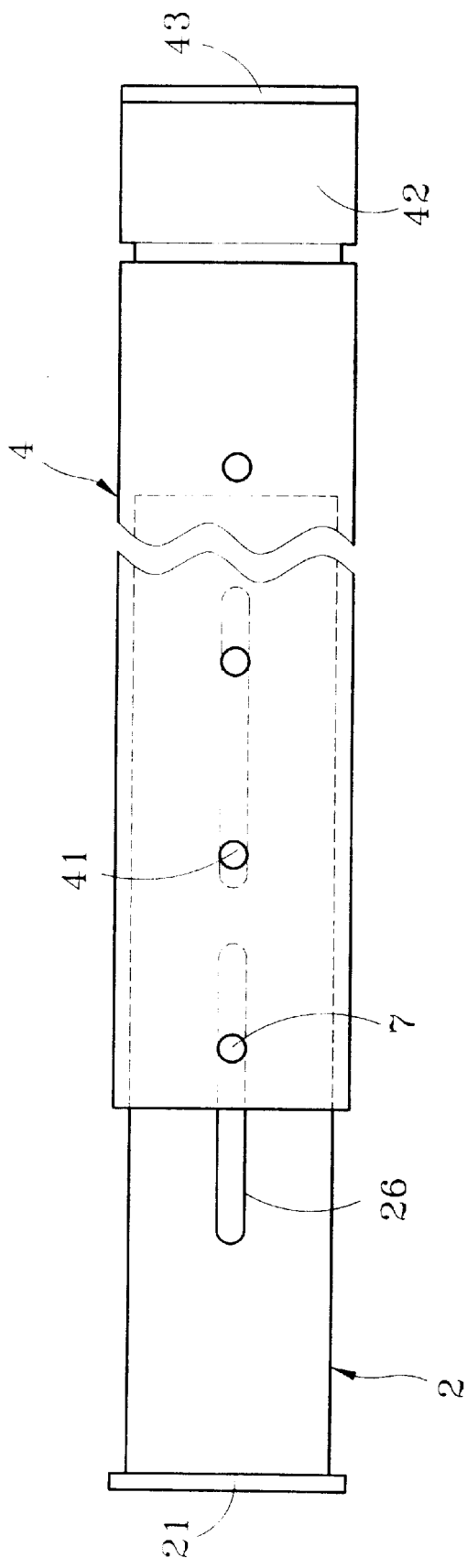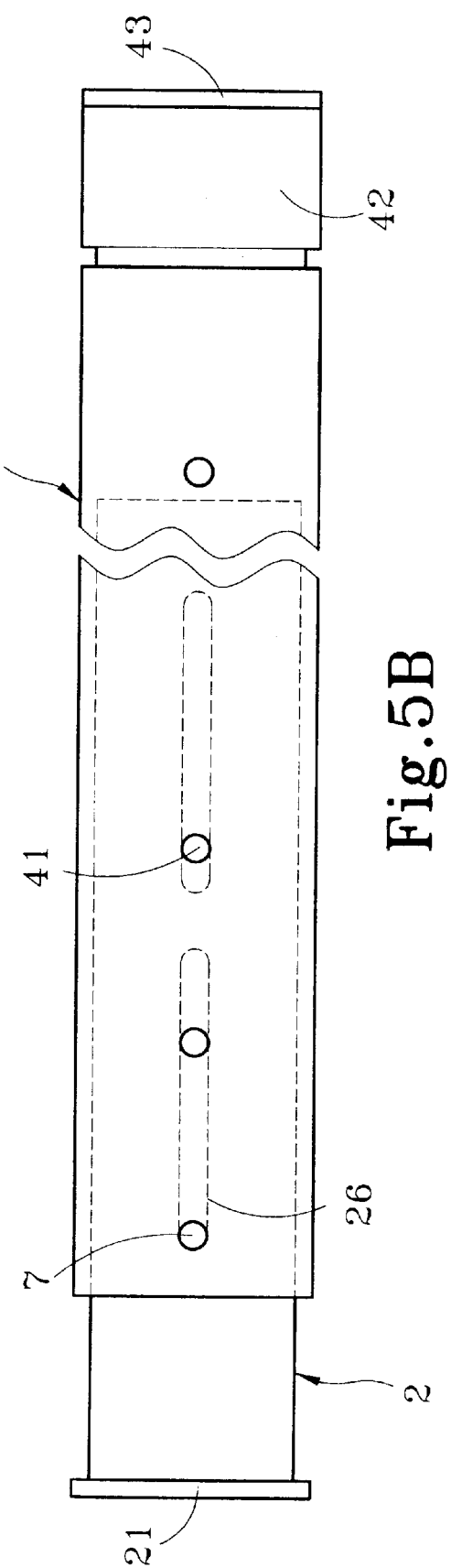
Fig.5A
Fig.5B

1

SLIDE OUT SUPPORT FOR SERVER CABINET

This application is a Continuation of nonprovisional application Ser. No. 09/736,214 filed Dec. 15, 2000 now abandoned.

BACKGROUND OF THE INVENTION

This invention relates to an improved slide out support for server cabinet and particularly a slide out support that has extensible front and rear beams to attain different length desired for holding servers of various lengths.

Conventional slide out support for a server cabinet to hold an industrial server processor, as shown in FIG. 1, usually includes a holding beam engaged with two end struts of the cabinet at a selected location, then the slide out support is fastened to the holding beam for supporting the server processor. The slide out support may be drawn or withdrawn for moving the processor out of or into the cabinet as desired. Such an construction has the following disadvantages:

1. There are established protocols for industrial computer processor that set height specifications at 1U, 2U or 4U. As users' requirements for internal element configuration and quantity are different, the processor length made by different manufacturers could be different. The length of the server cabinet has to change to accommodate various types of processor. Once the cabinet specifications changed, the design and construction of the slide out support structure and positioning strut also have to alter. In the server business, change of length for the processor and cabinet happens frequently. This entails frequent change requirements for the production and machining of the slide out support and positioning struts. It results in higher production cost. From users' standpoint, if damage or breakdown happened to an unique and batch-produced slide out support or positioning strut, there is no spare parts of same dimensions for replacement. It could cause a lot of problems for users and manufacturers.

2. In order to match configuration requirements of industrial computer processor, the height of the slide out support and positioning struts also have to change. Conventional server cabinet has displacement slots formed in the end struts to adjust the height for the positioning strut and computer processor. Users have to measure the processor dimensions and make the necessary relocation adjustment for installing the processor. Hence producers have to provide additional displacement slots on the end struts and users have to make measurement and relocation adjustment before the processor installation. All this increases production cost and makes installation not convenient.

SUMMARY OF THE INVENTION

In view of aforesaid disadvantages, it is therefore an object of this invention to adapt the slide out support structure directly to the height adjustment displacement slots set for industrial computer processor so that production cost may become lower and users may be freed from the inconvenience of doing measuring work.

The slide out support according to this invention includes a front beam and a rear beam which have respectively a bent first fastening flange and second fastening flange located at two opposite ends thereof for engaging with the cabinet end struts. The relative position of the first and second fastening flange may be adjusted for extending or shortening the length of the front and rear beam assembly to suit the server cabinet of various lengths.

BRIEF DESCRIPTION OF THE DRAWINGS

The invention, as well as its many advantages, may be further understood by the following detailed description and drawings, in which:

FIGS. 4A and 4B are top views of this invention, showing different lengths.

FIGS. 5A and 5B are side views of this invention, showing different lengths.

DESCRIPTION OF THE PREFERRED EMBODIMENTS

Figure 1:
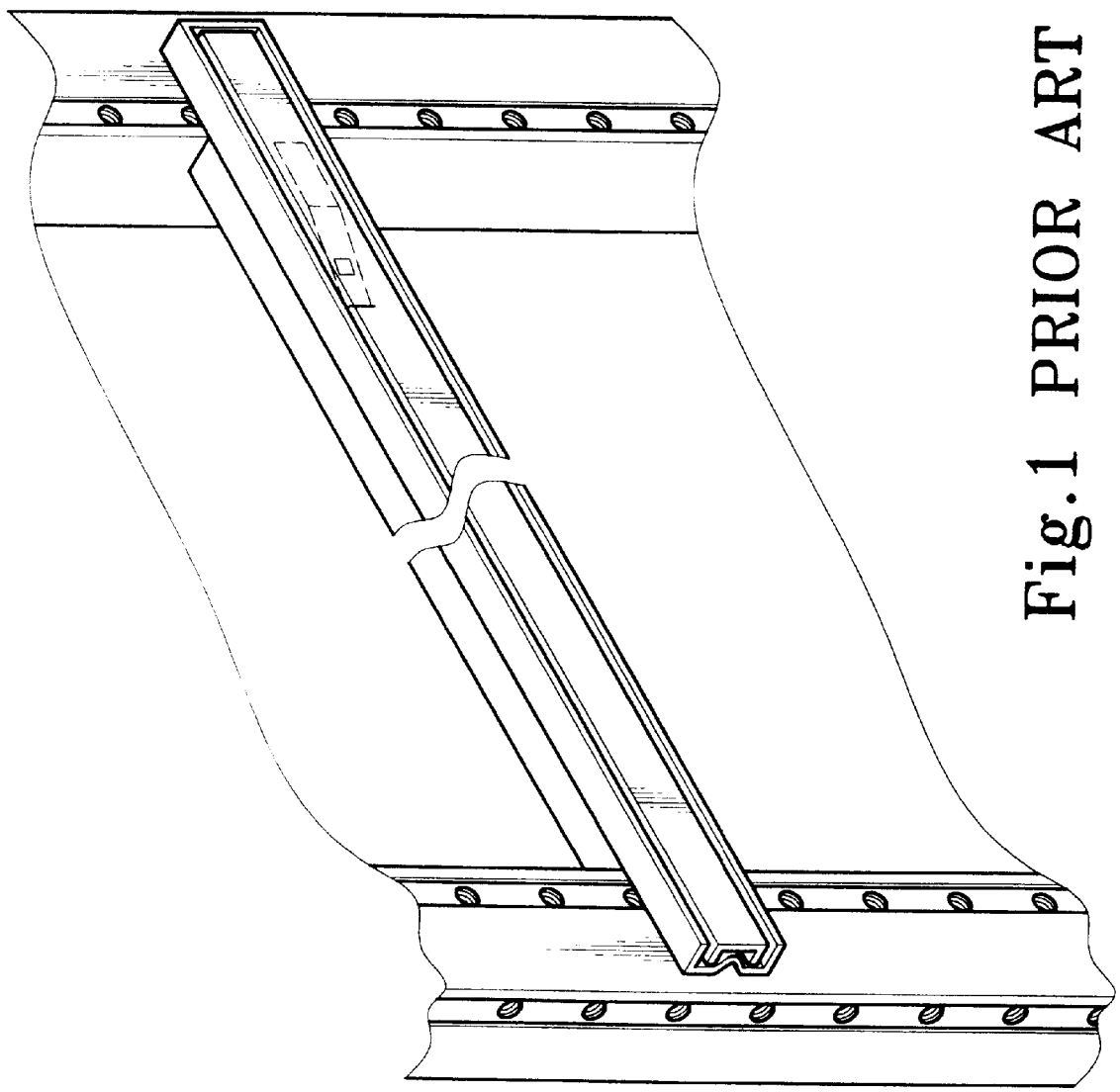
FIG. 1 is a perspective view of a conventional slide out support structure.
Figure 2:
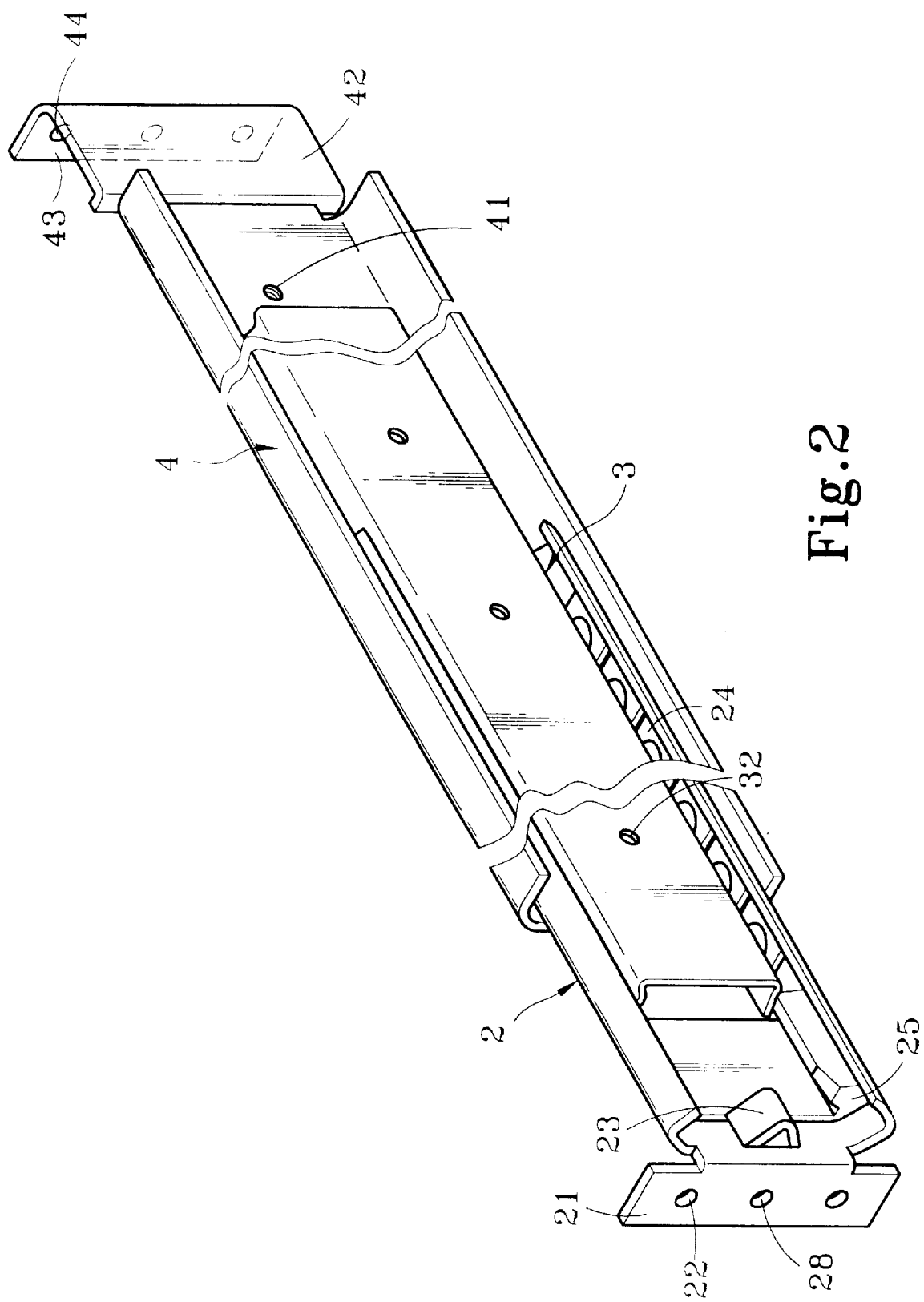
FIG. 2 is a perspective view of this invention.
Figure 3:
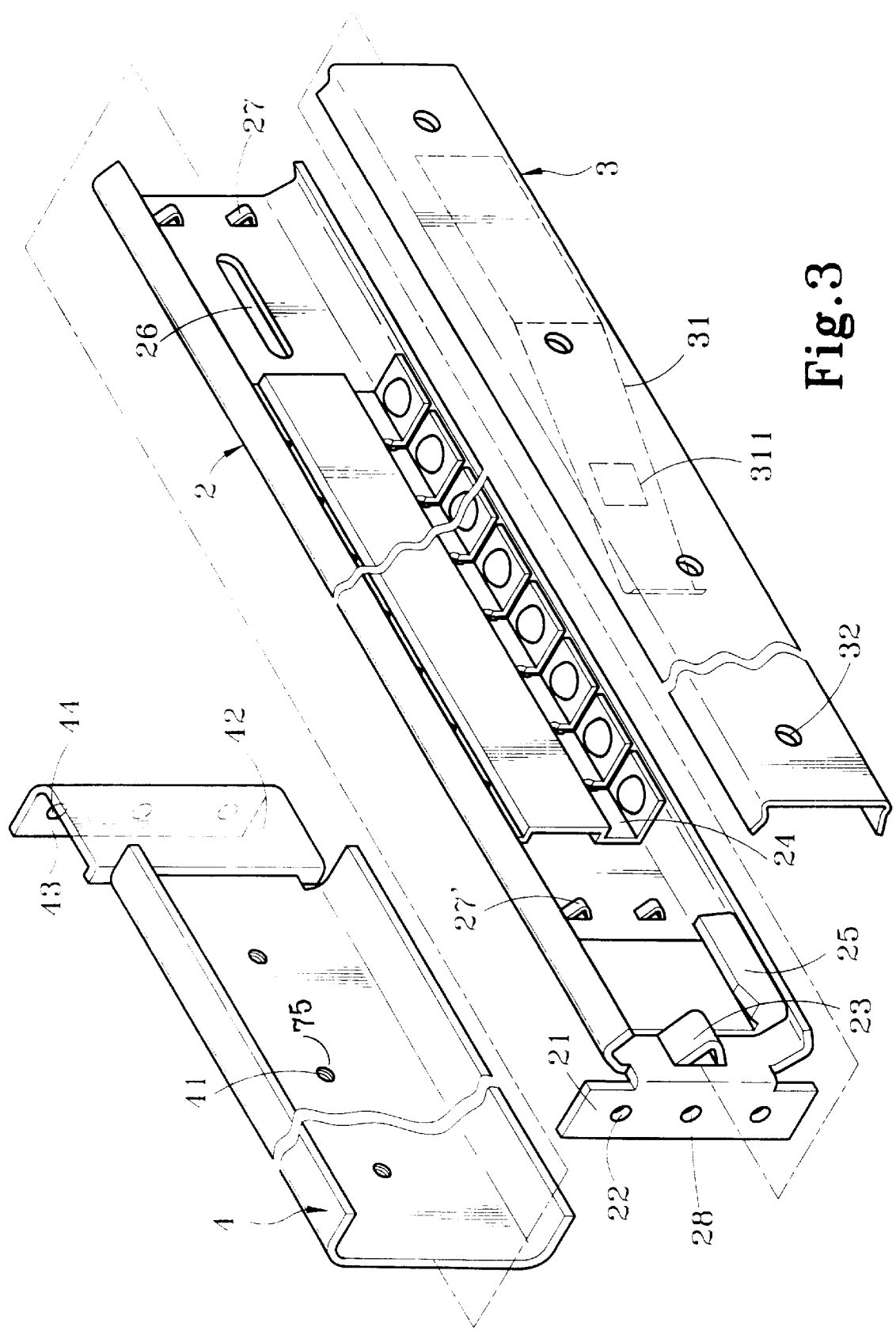
FIG. 3 is an exploded view of this invention.
Figure 7:
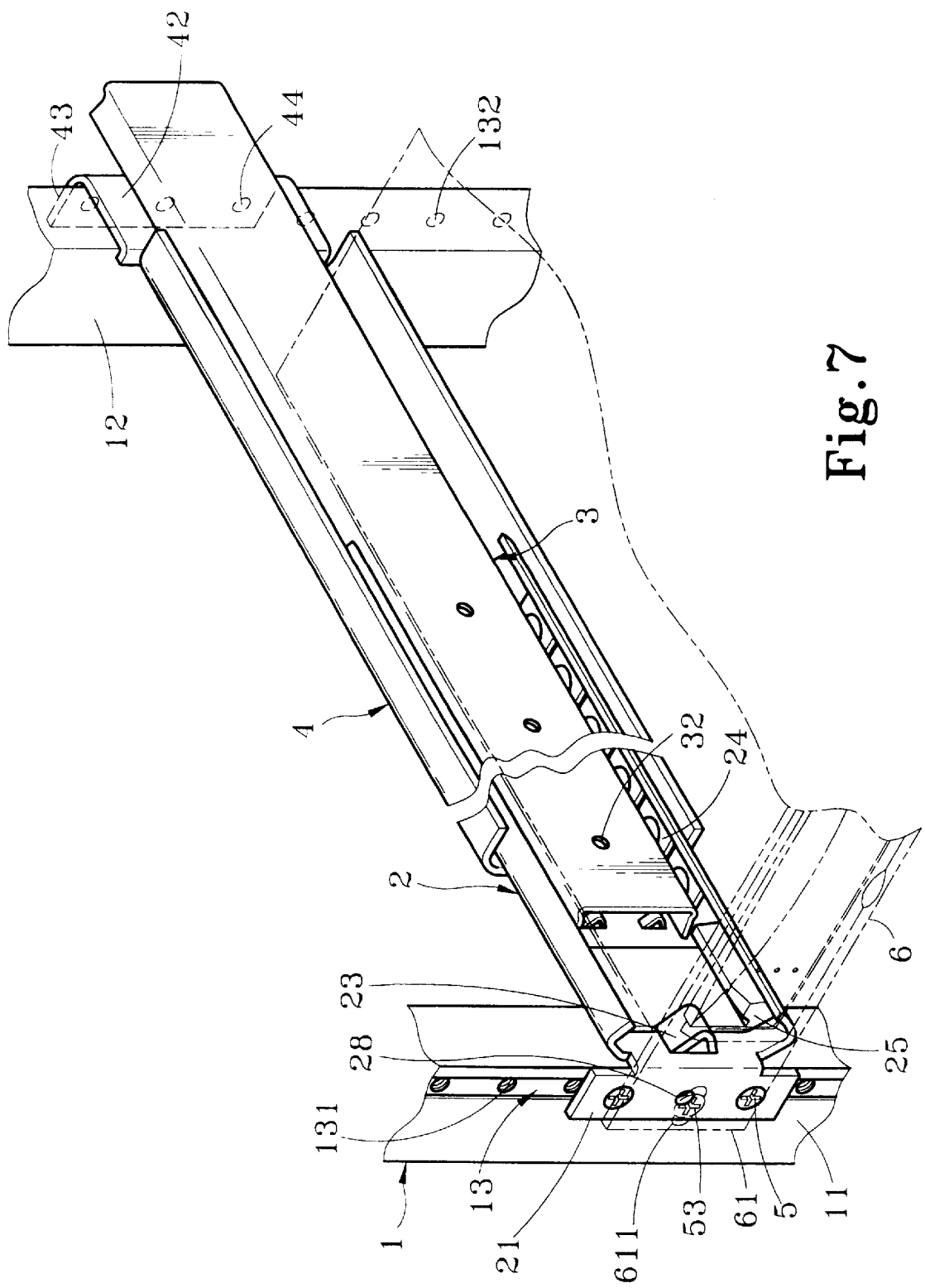
FIG. 7 is a schematic perspective view of this invention in use.

Referring to FIGS. 2, 3 and 7, the server cabinet 1 has a front end strut 11 and a rear end strut 12 for supporting a computer processor 6 (shown by phantom lines) and enabling the processor 6 be moved in or out. The slide out support of this invention includes a rear beam 4 and a front beam 2 held in the rear beam 4 to form an assembly. The front and rear beam 2 and 4 have respectively a first and second fastening flange 21 and 43 integrally formed at two opposite ends thereof. The fastening flanges 21 and 43 are bent respectively at a selected angle (preferably ninety-degree) for engaging with the front and rear end strut 11 and 12 through a fastener 5. The front and rear beam 2 and 4 further have respectively a first and second engaging member 26 and 41 formed therein to mate against each other. Through adjusting the relative engagement position of the engaging member 26 and 41, the assembly length of the front and rear beam 2 and 4 may be adjusted to extend or shorten to suit different lengths of server cabinet.

Figure 6:
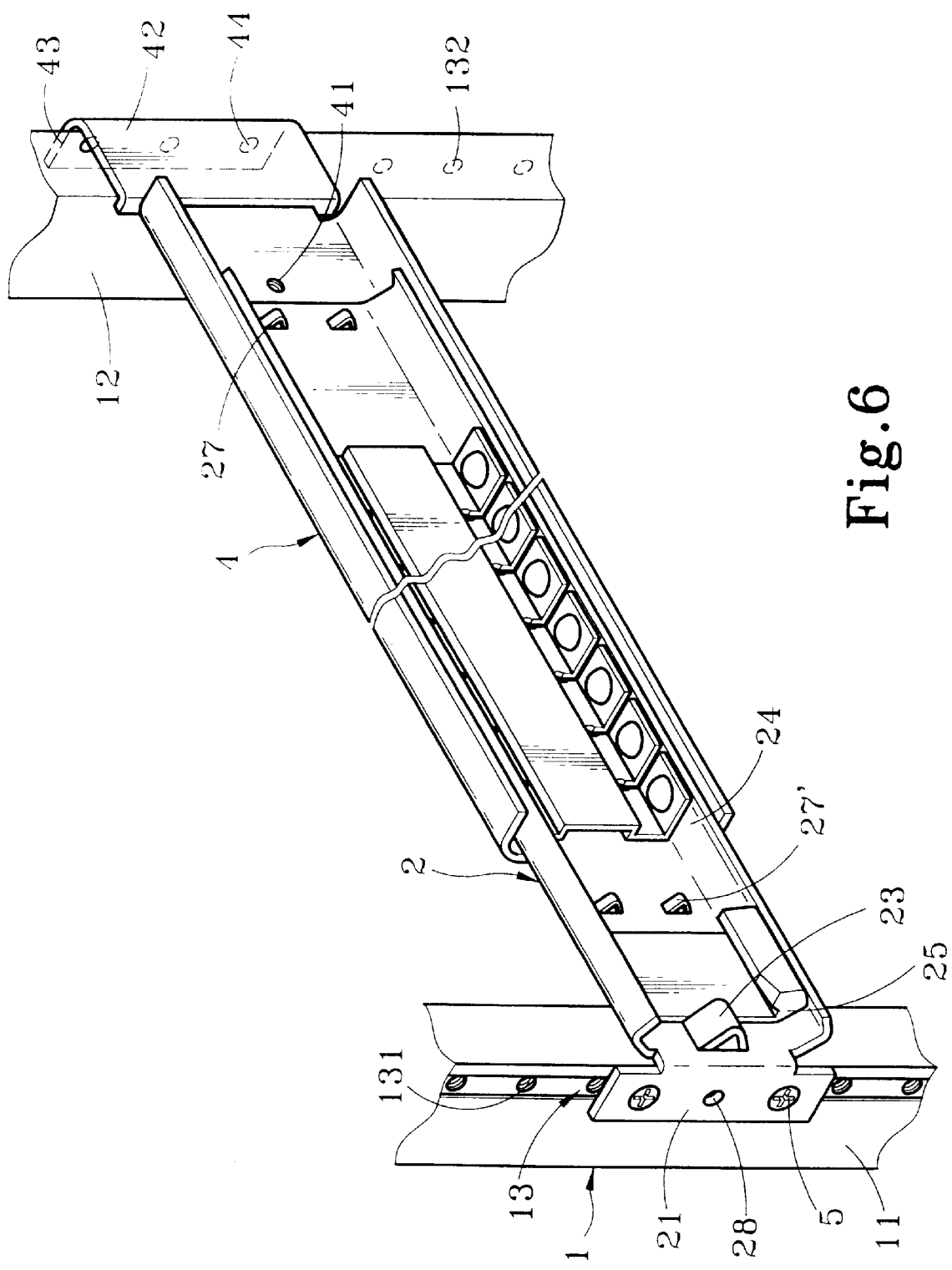
FIG. 6 is a schematic perspective view of this invention, mounting on a server cabinet.

FIGS. 4A, 5A and 6 illustrate this invention in use for mounting on a server cabinet 1. For using this invention, the front and rear end strut 11 and 12 of the cabinet 1 should respectively have a displacement channel 13 formed at two opposite sides thereof. The displacement channels 13 have respectively a plurality of screws bores 131 and 132 formed therein. The engaging member (such as the second engaging member 41) may be in the form of spaced screw bores with a selected interval (such as 50 mm in the embodiment of this invention), or in the form of a slot of selected length (such as the first engaging member 26 shown in FIG. 3). After the front and rear beam 2 and 4 are assembled, they may be moved longitudinally against each other to adjust the assembly length desired to suit a given server cabinet 1. After adjustment is done, the second engaging member 41 will be moved to a selected position relative to the first engaging member 26. Then a fastener 7 (such as a screw) may be used to engage the second engaging member 41 with the first engaging member 26 for fastening the front and rear beam 2 and 4 tightly together (shown in FIGS. 4A and 5B).

FIG. 3 illustrates engagement member 41 in the form of a threaded screw bore containing threads 75 therein so that a screw can be screwed into said screw bore to thereby function as the sole fastening device such as screw 7 shown in FIG. 4B.

The first and second fastening flange 21 and 43 have respectively apertures 22 and 44 mating against the screw bores 131 and 132. Hence the fastened beams 2 and 4 may be transversely mounted to the end struts 11 and 12 by engaging fasteners 5 (such as screws) with the apertures 22 (to couple with the screw bores 131), and apertures 44 (to couple with the screw bores 132) (shown in FIG. 6). As the screw bores 132 are located at a remote side of the rear beam 4 opposite to the front beam 2, the second fastening flange 43 has to extend beyond the width of the rear strut 12 for engaging with the rear beam 4. This may be accomplished by affixing a bent extension section 42 from the second flange 43 (shown in FIG. 6).

Referring to FIGS. 6 and 7, once the front and rear beam 2 and 4 are horizontally mounted to the cabinet 1, the server processor 6 (shown by phantom lines in FIG. 7) may be slid into the cabinet 1. This may be accomplished by fixing a slide beam 3 though the holes 32 to each of two lateral sides of the server processor 6, and slid the slide beam 3 along a guide ramp 25 located at the front end of the front beam 2 over a roller set 24 mounted on the front beam 2. There are punched stopping lugs 27' and 27 formed respectively at two opposite ends of the front beams 2 for preventing the roller set 24 from sliding out of the front beam 2 at either direction. The slide beam 3 enables the server processor 6 be drawn out or withdrawn into the cabinet 1 at a selected location (depending on the length of the slide beam 3 and its relative position with the processor 6). The processor 6 also has two side flanges 61 which has a full extended width greater than the opening width of the two front beams 11. Hence the side flanges 61 will hit the front beams 11 to stop the processor 6 from entering into the cabinet 6 too far. The side flange 61 further has an aperture 611 which may engage with a screw bore 28 formed in the first fastening flange 21 and screw bore 131 in the displacement channel 13 for securing the processor 6 in the cabinet 1 firmly whenever desired (the structure and function of the slide beam 3, guide ramp 25 and roller set 24 are known in the art, thus will be omitted herein). As a result, this invention may function flexibly without the length restriction happened to conventional slide out support. The assembly length of the front and rear beam 2 and 4 may be adjusted and changed to suit different length of processor 6 and be mounted to the server cabinet 1 of various lengths.

Referring to FIG. 3, this invention further provides a retainer 23 located at one side of the first fastening flange 21 for preventing the processor 6 from incidentally sliding out of the cabinet 1 and get damaged by dropping when the processor 6 is drawn out. To achieve this purpose, an elastic strip 31 is provided to attach to the slide beam 3 at a selected location. The elastic strip 31 has an opening 311 engageable with the retainer 23. When the processor 6 is withdrawn out of the cabinet 1, the spring force of the elastic strip 31 will push the opening 311 to engage to the retainer 23 so that the processor 6 will be stopped from sliding out of the cabinet 1. The roller set 24 also will be stopped by the stopping lug 27'. When there is need to move the processor 6 into the cabinet 1, pressing the elastic strip 31 at the free end, the opening 311 will be disengaged from the retainer 23 for the processor 6 free for moving into the cabinet 1 again.

It may thus be seen that the objects of the present invention set forth herein, as well as those made apparent from the foregoing description, are efficiently attained. While the preferred embodiment of the invention has been set forth for purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. An adjustable slide out support for use in a server cabinet wherein said support comprises:

a first beam with a roller set therein and a second beam wherein said first beam is moveably located in said second beam so that said first and second beams form a combined beam having two ends and said combined beam has a length which is adjustable by moving said first beam in said second beam, and said first beam includes a pair of punched stopping lugs at either end thereof for preventing said roller set from sliding out of said first beam, and said second beam includes an extension;

a first fastening flange on one end of said first beam and a second fastening flange attached to an end of said extension of said second beam whereby said first and second fastening flanges are located at both ends of said combined beam; said first and second fastening flanges being adapted for attachment to first and second struts respectively of a server cabinet wherein said first and second fastening flanges are formed by bending an end portion of said first and second beams respectively so that said first and second fastening flanges are respectively normal to said first and second beams and said first and second fastening flanges have respectively fastening apertures formed therein;

a punched retainer located along a side of said first fastening flange;

a slot located on said first beam and a threaded screw bore located on said second beam; said slot and said threaded screw bore being engageable with each other at various locations along said first and second beams; and means for fastening said first and second beams together and thereby fixing the length of said combined beam after adjustment of said length so that said first and second fastening flanges are spaced apart from each other for attachment to said first and second struts of a server cabinet wherein said means for fastening said first and second beams together consists of a screw which extends through said slot and which is screwed into said threaded screw bore.

* * * * *